United States Patent
Biris et al.

(10) Patent No.: US 8,337,951 B2
(45) Date of Patent: Dec. 25, 2012

(54) SUPERHYDROPHOBIC SURFACE AND METHOD OF FORMING SAME USING HIGH-ASPECT RATIO NANO-TEXTURE

(75) Inventors: Alexandru S. Biris, Little Rock, AR (US); Ganesh K. Kannarpady, Little Rock, AR (US)

(73) Assignee: Board of Trustees of the University of Arkansas, Little Rock, AR (US)

(*) Notice: Subject to any disclaimer, the term of this patent is extended or adjusted under 35 U.S.C. 154(b) by 262 days.

(21) Appl. No.: 12/754,237

(22) Filed: Apr. 5, 2010

(65) Prior Publication Data

US 2010/0279084 A1 Nov. 4, 2010

Related U.S. Application Data

(60) Provisional application No. 61/211,824, filed on Apr. 3, 2009.

(51) Int. Cl.
C23C 16/26 (2006.01)

(52) U.S. Cl. .................. 427/255.1; 427/255.7; 427/307

(58) Field of Classification Search ............... 427/255.1, 427/255.7, 307
See application file for complete search history.

(56) References Cited

U.S. PATENT DOCUMENTS

| | | | |
|---|---|---|---|
| 5,063,081 A * | 11/1991 | Cozzette et al. | 435/4 |
| 6,010,744 A * | 1/2000 | Buskirk et al. | 427/81 |
| 6,036,774 A * | 3/2000 | Lieber et al. | 117/105 |
| 6,206,065 B1 | 3/2001 | Robbie et al. | |
| 6,960,528 B2 | 11/2005 | Chen et al. | |
| 7,276,172 B2 * | 10/2007 | Wessels et al. | 216/2 |
| 8,084,087 B2 * | 12/2011 | Bent et al. | 427/255.28 |
| 2004/0209190 A1 * | 10/2004 | Mori et al. | 430/311 |
| 2006/0228723 A1 | 10/2006 | Bradley et al. | |
| 2006/0258054 A1 * | 11/2006 | Pan et al. | 438/122 |
| 2006/0258132 A1 | 11/2006 | Brown et al. | |
| 2006/0290343 A1 | 12/2006 | Crafts et al. | |
| 2007/0166539 A1 | 7/2007 | Zhao et al. | |
| 2008/0206936 A1 | 8/2008 | Fernandez-Ceballos et al. | |
| 2009/0082216 A1 | 3/2009 | Cohn et al. | |
| 2009/0211632 A1 | 8/2009 | Brett et al. | |

OTHER PUBLICATIONS

Tsoi, Shufen, et al., "Superhydrophobic, High Surface Area, 3-D SiO2 Nanostructures through Siloxane-Based Surface Functionalization". Langmuir 2004, 20, 10771-10774.*
Nakajima, Akira, et al., "Transparent Superhydrophobic Thin Films with Self-Cleaning Properties". Langmuir 2000, 16, 7044-7047.*
Fan, J-G, et al., "Water contact angles of vertically aligned Si nanorod arrays". Nanotechnology 15 (2004) pp. 501-504.*
Liu, Huaping, et al., "Controlled growth of Fe catalyst film for synthesis of vertically aligned carbon nanotubes by glancing angle deposition". Surface and Coatings Technology 201 (2006) 938-942.*
Zhao, Y.P., et al., "Designing Nanostructures by Glancing Angle Deposition". Proceedings of SPIE vol. 5219 Nanotubes and Nanowires, edited by Akhlesh Lakhtakia, Sergey Maksimenko (SPIE, Bellingham, WA, 2003) pp. 59-73.*
Kesapragada, S.V., et al., "Ta nanotubes grown by glancing angle deposition". J. Vac. Sci. Technol. B 26(2), Mar./Apr. 2008, pp. 678-681.*
Mulherin, ND, RB Haehnel, JF Jones, "Toward developing a standard shear test fro ice adhesion", Proceedings, 8th International Workshop on Atmospheric Icing Structures,Reykjavik, Iceland, Jun. 8-11, 1998, IWAIS '98.
Lafuma, D. Quere, "Superhydrophobic states", Nature Materials, 2 (2003) 457-460.
Young, T., "An Essay on the Cohesion of Fluids"Phil. Trans. R. Soc. Lond., 95 (1805) 65-87.
Wenzel,R. N., "Resistance of solid surfaces to wetting by water", Ind. Eng. Chem. 28. 988-994 (1936).
Cassie, A. B. D. & Baxter, S., "Wettability of porous surfaces", Trans. Faraday Soc. 40, 546-551 (1944).

* cited by examiner

*Primary Examiner* — Bret Chen
(74) *Attorney, Agent, or Firm* — Morris, Manning & Martin, LLP; Tim Tingkang Xia, Esq.

(57) ABSTRACT

Certain aspects of the present disclosure are directed to a method of forming a superhydrophobic surface. The method includes: preparing a surface of a substrate of a first material; modifying the surface through an etching process to generate a plurality of nucleation sites in an array; forming, by using glancing angle deposition, a plurality of nano-rods of a second material and each at a respective one of the plurality of nucleation sites in the array; and depositing a conformal coating on the plurality of nano-rods.

20 Claims, 4 Drawing Sheets

SUPERHYDROPHOBIC SURFACE AND METHOD OF FORMING SAME USING HIGH-ASPECT RATIO NANO-TEXTURE

CROSS-REFERENCE TO RELATED PATENT APPLICATION

This application claims the benefit, pursuant to 35 U.S.C. §119(e), of U.S. provisional patent application Ser. No. 61/211,824, filed Apr. 3, 2009, entitled "Superhydrophobicity Using High Aspect Ratio Nano-Texture Fractal Surface Roughness," by Alexandru S. Biris and Ganesh K. Kannarpady, which is incorporated herein by reference in its entirety.

Some references, which may include patents, patent applications and various publications, are cited in a reference list and discussed in the description of this invention. The citation and/or discussion of such references is provided merely to clarify the description of the present invention and is not an admission that any such reference is "prior art" to the invention described herein. All references, if any, listed, cited and/or discussed in this specification are incorporated herein by reference in their entireties and to the same extent as if each reference was individually incorporated by reference. In terms of notation, hereinafter, "[n]" represents the nth reference cited in the reference list. For example, [3] represents the $3^{rd}$ reference cited in the reference list, namely, Young, T., "An Essay on the Cohesion of Fluids", *Phil. Trans. R. Soc. Lond.*, 95 (1805) 65-87.

FIELD OF THE INVENTION

The present invention relates generally to the field of superhydrophobicity, in particular, to superhydrophobic surface formed using high aspect ratio nano-texture fractal surface roughness and method of forming same.

BACKGROUND

Superhydrophobicity or Lotus Effect is the ability of a surface to repel water completely by making them to roll off from the surface. Different surfaces have different contact angles with water. Normally, normal hydrophobic surface has contact angle of about 90-120° with water drops. On such surfaces water can form a semi spherical drop instead of uniformly wetting the surface, but still need a large tilt to roll them off the surface. However, certain metallic or polymer surfaces can be tailored to achieve the contact angle of more than 150° with water and known as super hydrophobic surface. On such surfaces water can form a perfect spherical drop and can be rolled off even on the horizontal surface. The best example of a super hydrophobic surface can be found in the nature. There are hundreds of plant leaves including lotus leave, that show superhydrophobicity. Mimicking such mechanism on metal, alloy, composite or polymer surface can find a lot of applications in the areas of airplanes, automobiles, electronics, etc.

One such important application is in the area of aerospace industry. Ice formation on the body of airplanes poses several problems like increasing drag and decreasing lift. Very thin ice sheets on leading edges of airplane airfoils can reduce the lift as much as 30-40% [1]. Ice can also cause engine stoppage due to its accumulation on carburetor and the engine's air source. Hence it is very important to protect the surface of the airplane and other crucial parts from the accumulation of ice. While there are many ways of avoiding ice formation, such as keeping the airplane body surface always above 0° C., most of the times it is not practical since it is difficult to maintain the heat on all parts of the body. Hence making airplane body surface super hydrophobic may save a lot of money and energy, and more importantly, improve the safety of airplanes.

There are many ways of achieving the super hydrophobic surface. Water is a polar solvent and hence if a surface can be modified into polar surface, then water can easily repel from the surface. However, such surface modification is not always straightforward. In addition, the reliability of such treated surfaces is not guaranteed under extreme conditions. Rough surfaces with different micro texture have shown high water repellent behavior. There are many ways of modifying surface texture and many references can be found in literature. In fact, a near perfect super hydrophobic surface with a contact angle of 178° has been achieved. However, such surfaces still lack the ability in terms of sustainability under extreme weather conditions such as icing conditions.

Therefore, a heretofore unaddressed need exists in the art to address the aforementioned deficiencies and inadequacies.

SUMMARY OF THE INVENTION

In one aspect, the present invention provides a method of forming a superhydrophobic surface. In one embodiment, the method has the steps of:

preparing a surface of a substrate of a first material;

modifying the surface through an etching process to generate a plurality of nucleation sites; and depositing a source material of a second material on the modified surface by using glancing angle deposition to form a plurality of nano-rods corresponding to the plurality of nucleation sites.

In yet another aspect, the present invention provides an article of manufacture a having a superhydrophobic surface made by the method set forth immediately above.

In another aspect, the present invention provides an article of manufacture. In one embodiment, the article of manufacture has:

a substrate of a first material, wherein the substrate has a first surface and an opposite, second surface;

a plurality of nucleation sites formed on the second surface; and a plurality of nano-rods of a second material formed on the second surface corresponding to positions where the plurality of nucleation sites is located to form a superhydrophobic surface, wherein the plurality of nucleation sites is formed on the second surface by modifying the surface through an etching process, and wherein the plurality of nano-rods of a second material is formed on the second surface corresponding to positions where the plurality of nucleation sites is located by depositing a source material of the second material on the modified surface by using glancing angle deposition.

These and other aspects of the present invention will become apparent from the following description of the preferred embodiment taken in conjunction with the following drawings and their captions, although variations and modifications therein may be affected without departing from the spirit and scope of the novel concepts of the disclosure.

BRIEF DESCRIPTION OF THE DRAWINGS

FIG. 2 schematically shows: (a) a substrate of a first material to be prepared for forming a superhydrophobic surface;

(b) a plurality of nucleation sites is formed by an etching process; and (c) a superhydrophobic surface, or a high aspect ratio nano-texture surface, with a conformal coating of polymer or silanes, which is formed according to one embodiment of the present invention.

DETAILED DESCRIPTION

The present invention is more particularly described in the following examples that are intended as illustrative only since numerous modifications and variations therein will be apparent to those skilled in the art. Various embodiments of the invention are now described in detail. Referring to the drawings, FIGS. 1-3, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

Definitions

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "scanning electron microscope (SEM)" refers to a type of electron microscope that images the sample surface by scanning it with a high-energy beam of electrons in a raster scan pattern. The electrons interact with the atoms that make up the sample producing signals that contain information about the sample's surface topography, composition and other properties such as electrical conductivity.

As used herein, the term "Raman spectroscopy" or "Raman technique" refers to an optical technique that probes the specific molecular content of a sample by collecting in-elastically scattered light. As photons propagate through a medium, they undergo both absorptive and scattering events. In absorption, the energy of the photons is completely transferred to the material, allowing either heat transfer (internal conversion) or re-emission phenomena such as fluorescence and phosphorescence to occur. Scattering, however, is normally an in-elastic process, in which the incident photons retain their energy. In Raman scattering, the photons either donate or acquire energy from the medium, on a molecular level. In contrast to fluorescence, where the energy transfers are on the order of the electronic bandgaps, the energy transfers associated with Raman scattering are on the order of the vibrational modes of the molecule. These vibrational modes are molecularly specific, giving every molecule a unique Raman spectral signature.

Raman scattering is a very weak phenomena, and therefore practical measurement of Raman spectra of a medium requires high power excitation laser sources and extremely sensitive detection hardware. Even with these components, the Raman spectra from tissue are masked by the relatively intense tissue auto-fluorescence. After detection, post processing techniques are required to subtract the fluorescent background and enable accurate visualization of the Raman spectra. Raman spectra are plotted as a function of frequency shift in units of wavenumber ($cm^{-1}$). The region of the Raman spectra where most biological molecules have Raman peaks is from 500 to 2000 $cm^{-1}$. In contrast to fluorescence spectra, Raman spectra have sharp spectral features that enable easier identification of the constituent sources of spectral peaks in a complex sample.

As used herein, the term "chemical etching", also known as "chemical milling", refers to a process of using an etching chemical solution such as acids, bases or other chemicals to dissolve unwanted materials such as metals, semiconductor materials or glass. This process has been used on a wide variety of metals with depths of metal removal as large as 12 mm (0.5 in) and as small as in nano-size. Selective attack by the chemical reagent on different areas of the workpiece surfaces is controlled by removable layers of material called masking or by partial immersion in the reagent. For practicing the present invention, both wet etching and photochemical etching, the two main types of chemical etching techniques, can be utilized. The etching chemical solution is chosen corresponding to the material, from which the substrate, or at least the etching surface, is made. For non-limiting, exemplary examples, if the substrate, or at least the etching surface, is made from silica or silicon dioxide, a corresponding etching chemical solution would be hydrofluoric acid (HF), among other choices; if the substrate, or at least the etching surface, is made from copper, a corresponding etching chemical solution would be any one of ferric chloride, ammonium persulfate, ammonia, and 25-50% nitric acid, among other choices; if the substrate, or at least the etching surface, is made from steels, a corresponding etching chemical solution would be any one of hydrochloric and nitric acids, ferric chloride for stainless steels, Nital (a mixture of nitric acid and ethanol, methanol, or methylated spirits for mild steels), 2% Nital (a common etchant for plain carbon steels), among other choices; and if the substrate, or at least the etching surface, is made from aluminum, a corresponding etching chemical solution would be sodium hydroxide, among other choices.

As used herein, the term "plasma etching" refers to a form of plasma processing used to fabricate integrated circuits. It involves a high-speed stream of glow discharge (plasma) of an appropriate gas mixture being shot (in pulses) at a sample. The plasma source, known as etch species, can be either charged (ions) or neutral (atoms and radicals). During the process, the plasma will generate volatile etch products at room temperature from the chemical reactions between the elements of the material etched and the reactive species generated by the plasma. Eventually the atoms of the shot element embed themselves at or just below the surface of the target, thus modifying the physical properties of the targets.

As used herein, the term "Glancing Angle Deposition" or "GLAD" refers to a thin-film deposition technique that putting the incident flux of source materials, consisting of atoms and molecules from gas phase, at a glancing angle to the substrate during deposition to form highly underdense, columnar microstructures which are purposely engineered to achieve novel desired properties. The so-called shadowing effect can create various kinds of nano or micro structures on the substrate. For glancing angle deposition, the deposition can be thermal vapor deposition, pulsed laser deposition and magnetron deposition. For practicing the present invention, a source material is deposited on a substrate by using a magnetron sputtering technique at a glancing angle in one embodiment. Both thermal vapor deposition and pulsed laser deposition are alternatively utilized to practice the present invention. Sculptured thin films (STF) containing engineered complex structures such as nanospirals and zigzag columns can be achieved by rotating the substrate about the polar axis in predefined cycles. The polar angle determines the column growth direction while the azimuthal angle controls the column tilt angle and affects the degree of shadowing and thus the porosity of the layer. GLAD on flat substrates involves a stochastic nucleation process yielding layers consisting of randomly distributed columns. In contrast, periodic arrays are achieved by substrate patterning prior to deposition, where the patterned surface mounds are the nucleation sites for the GLAD columns, since atomic shadowing of the deposition flux suppresses growth on the surrounding substrate.

As used herein, "nanoscopic-scale," "nanoscopic," "nanometer-scale," "nanoscale," "nanocomposites," "nanoparticles," the "nano-" prefix, and the like generally refers to elements or articles having widths or diameters of less than about 1 μm, preferably less than about 100 nm in some cases. In all embodiments, specified widths can be smallest width (i.e. a width as specified where, at that location, the article can have a larger width in a different dimension), or largest width (i.e. where, at that location, the article's width is no wider than as specified, but can have a length that is greater).

As used herein, "carbon nanostructures" refer to carbon fibers or carbon nanotubes that have a diameter of 1 μm or smaller which is finer than that of carbon fibers. However, there is no particularly definite boundary between carbon fibers and carbon nanotubes. By a narrow definition, the material whose carbon faces with hexagon meshes are almost parallel to the axis of the corresponding carbon tube is called a carbon nanotube, and even a variant of the carbon nanotube, around which amorphous carbon exists, is included in the carbon nanotube.

As used herein, "plurality" means two or more.

As used herein, the terms "comprising," "including," "carrying," "having," "containing," "involving," and the like are to be understood to be open-ended, i.e., to mean including but not limited to.

Overview of the Invention

The present invention provides, among other things, a surface modification of metals, alloys, ceramics, polymers based on a high-aspect ratio nano-texture. In one aspect, superhydrophobic surfaces formed according to various embodiments of the present invention have modified surface roughness, which is expected to increase the contact angle of water to more than 150° and sustaining Cassie effect even in the extreme condition(s). Retaining the Cassie effect on the surface even in the extreme conditions like ice is important since external stress can yield an efficient protection for aerospace applications. However, the application of the present invention is not just limited to aerospace industry; it can find applications in all the other fields where the protection from water is desired.

While most results disclosed herein are based on Si substrate, it is understood that people skilled art can apply the process/methods of the present invention to substrates that are made from other semiconductors or flexible thin-films. Thus, in one aspect, the present invention provides a method of forming a superhydrophobic surface. In one embodiment, the method has the steps of:

preparing a surface of a substrate of a first material;

modifying the surface through an etching process to generate a plurality of nucleation sites; and depositing a source material of a second material on the modified surface by using glancing angle deposition to form a plurality of nano-rods corresponding to the plurality of nucleation sites.

In one embodiment, the step of depositing is performed at a deposition angle between 60° and 90° from surface normal. Each of the plurality of nano-rods has a height to width aspect ratio of greater than 1. In one embodiment, each of the plurality of nano-rods has a width in the range between about 10 to 100 nm.

In one embodiment, the spacing between two adjacent nano-rods is in the range between about 10 to 100 nm. The spacing between two adjacent nano-rods is greater than the width of a nano-rod.

In one embodiment, the first material is one of a dielectric material, a semiconductor material, an insulator material such as ceramics, a conductor material such as metal or alloy, a polymer material such as polymer and an inorganic material. The second material is same as or different from the first material. In one embodiment, the second material is one of a dielectric material, a semiconductor material, an insulator material such as ceramics, a conductor material such as metal or alloy, a polymer material such as polymer and an inorganic material.

In one embodiment, the etching process comprises a chemical etching process, wherein the chemical etching process comprises a step of dipcoating, spincoating, spray coating, or painting.

In another embodiment, the etching process comprises a dry plasma etching process.

The depositing step is performed using one of thermal vapor deposition, pulsed laser deposition, magnetron deposition, sputtering deposition, and e-beam evaporation. Moreover, the depositing step is controlled such that the deposition path is one of a zigzag path, a row by row path, a column by column path, and a progressive circular path from the outside perimeter to the center of the second surface one circle at a time or vice versa.

In one embodiment, the preparing step comprises the step of cleaning the surface of the substrate.

The method further comprises the step of applying a coating material on the surface following the depositing step. In one embodiment, the coating material is one of Teflon, a polymer that is not Teflon, and silane.

In yet another aspect, the present invention provides an article of manufacture a having a superhydrophobic surface made by the method set forth immediately above.

In another aspect, the present invention provides an article of manufacture. In one embodiment, the article of manufacture has:

a substrate of a first material, wherein the substrate has a first surface and an opposite, second surface;

a plurality of nucleation sites formed on the second surface; and a plurality of nano-rods of a second material formed on the second surface corresponding to positions where the plurality of nucleation sites is located to form a superhydrophobic surface, wherein the plurality of nucleation sites is formed on the second surface by modifying the surface through an etching process, and wherein the plurality of nano-rods of a second material is formed on the second surface corresponding to positions where the plurality of nucleation sites is located by depositing a source material of the second material on the modified surface by using glancing angle deposition.

In one embodiment, the first material is one of a dielectric material, a semiconductor material, an insulator material such as ceramics, a conductor material such as metal or alloy, a polymer material such as polymer and an inorganic material. The second material is same as or different from the first material. In one embodiment, the second material is one of a dielectric material, a semiconductor material, an insulator material such as ceramics, a conductor material such as metal or alloy, a polymer material such as polymer and an inorganic material.

Additional details are set forth below.

EXAMPLES

Aspects of the present teachings may be further understood in light of the following examples, which should not be construed as limiting the scope of the present teachings in any way.

Example 1

Theoretical framework for the present invention. The general theory of the behavior of water drops on hydrophobic rough surface is explained by Lafuma et al [2].

Figure 1:
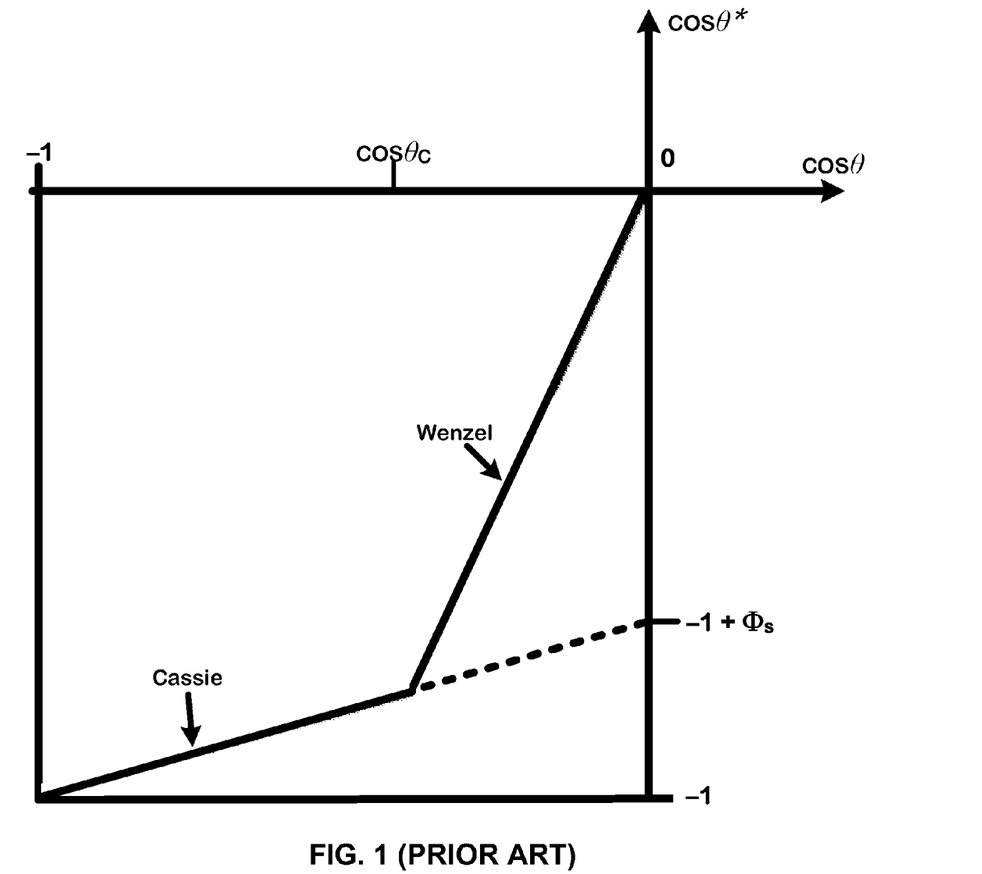
FIG. 1 schematically shows two models of superhydrophobic states [2].

FIG. 1 shows the variation of the apparent contact angle $\theta^*$ on a hydrophobic rough surface as a function of Young's Contact angle $\theta$, determined on the flat surface of the same solid [1].

In the Wenzel model [4], $\cos \theta^* = r \cos \theta$, where r is the ratio of actual over the apparent surface area of the substrate.

On the other hand, in the Cassie model [5], $\cos \theta^* = -1 + \Phi_s (1 + \cos \theta)$, where $\Phi_s$ is the fractal surface area of the solid when the other surface is air with which the contact angle of water is 180°.

Basically, Lafuma et al. [2] have studied under what conditions Cassie and Wenzel models stabilize and under what conditions both models can co-exist. As seen in the figure, Cassie model stabilizes as the contact angle $\theta$ is above the critical angle $\theta c$. Hence, larger the Young's contact angle of a rough solid surface, higher the apparent contact angle leading to super hydrophobic state. For moderate or lower Young's contact angle of the rough solid surface, water forms mostly Wenzel drop with less superhydrophobicity. On the other hand, for a rough solid surface with low Young's contact angle $\theta$, one can increase the r (the ratio of actual to apparent surface area) by increasing the roughness. The paper also discusses different experimental conditions in which superhydrophobicity can fail. They have studied different static and dynamic conditions of water drop formation and their effect on superhydrophobicity of the rough surface. In particular, the rough surface made out of square lattice with triangular spikes studied in the paper, it was showed that the external pressure can reduce effective Cassie's contact angle even with high Young's contact angle. The other parameter that can affect the superhydrophobicity is the invasion of water in the cavities of rough surface by dew or evaporation of water. This can replace the air inside the cavity and thereby making the water drop into a Wenzel drop (or more wettability).

Example 2

Two-stage surface modification process-preparing a substrate. A two-stage surface modification process that generates high aspect ratio nano texture coated with a polymer or silanes as an anti adhesive coating is invented and practiced according to various embodiments of the present invention.

Figure 2A:
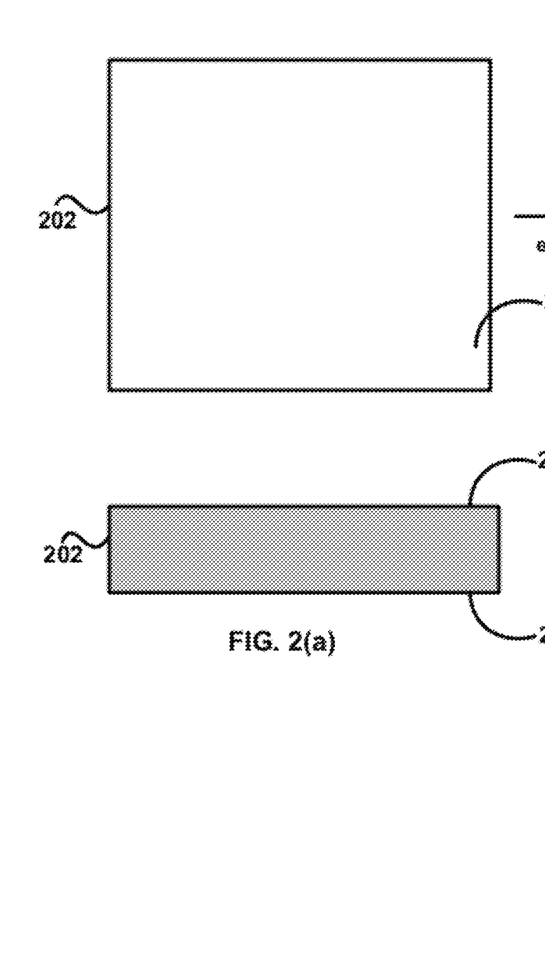
Figure 2B:
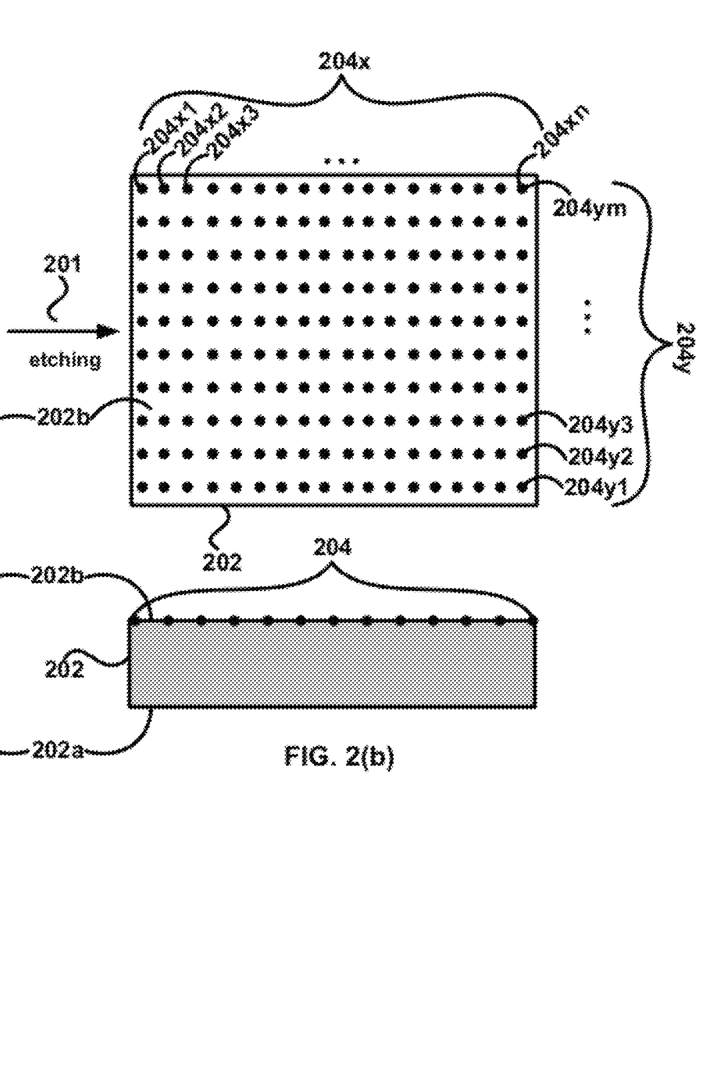
Figure 2C:
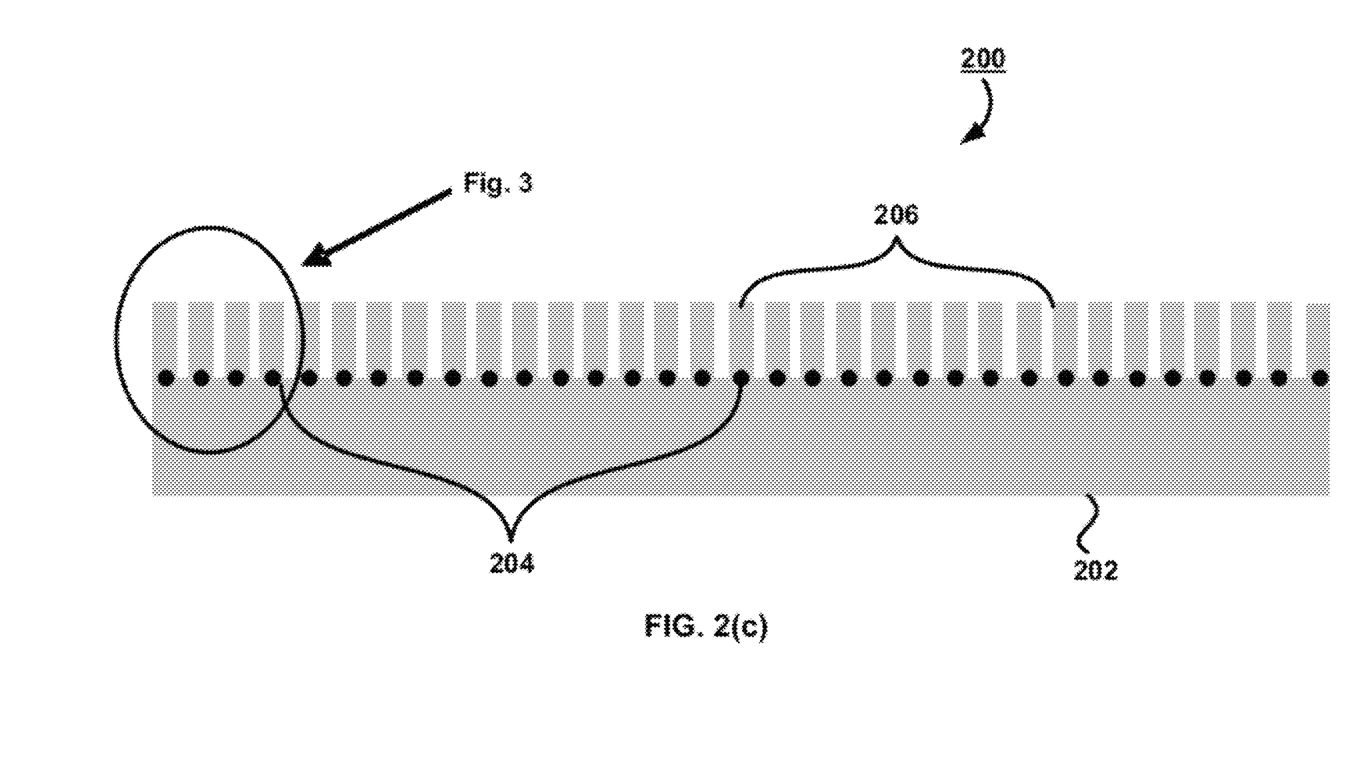
Figure 3:
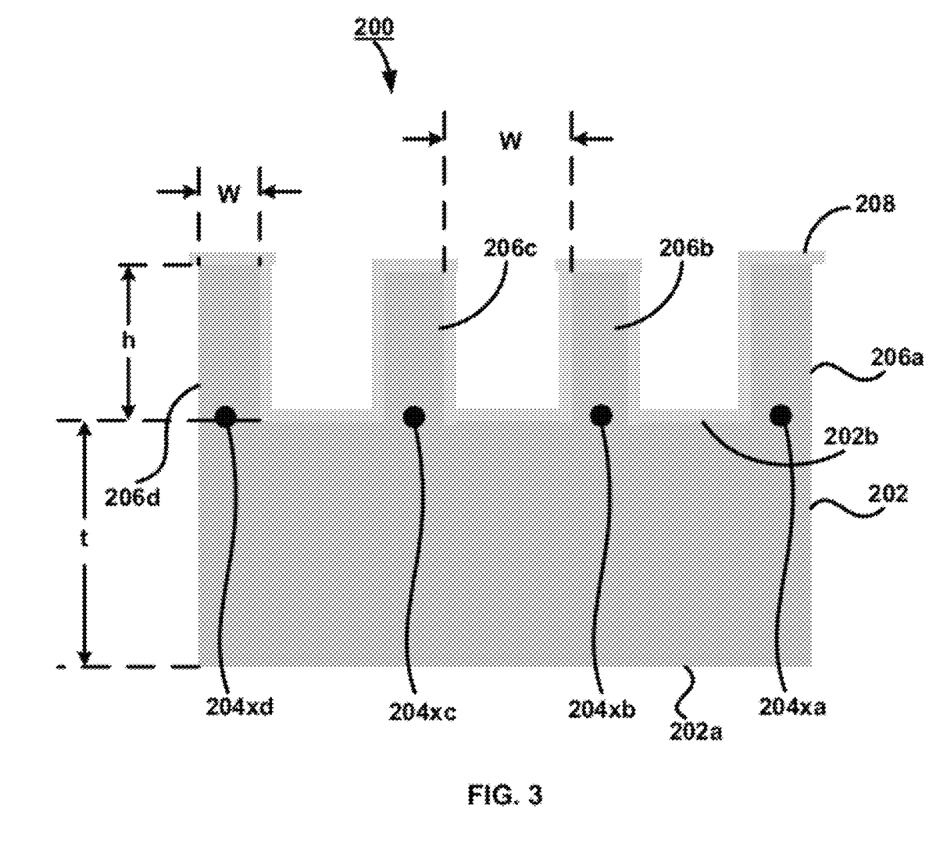
FIG. 3 schematically shows a close look of the high aspect ratio nano-texture surface with a conformal coating of polymer or silanes of FIG. 2, which is formed according to one embodiment of the present invention.

In one embodiment of the present invention, referring now to FIGS. 2-3, a substrate 202 is first prepared. The substrate 202 has a first surface 202a, and an opposite, second surface 202b. The substrate 202 is made from a first material that is one of a dielectric material, a semiconductor material, an insulator material such as ceramics, a conductor material such as metal or alloy, a polymer material such as polymer and an inorganic material.

The first stage of surface modification involves an etching of a surface of the substrate 202. Either the first surface 202a or the second surface 202b can be chosen. For the embodiments shown in FIGS. 2-3, the second surface 202b is chosen as the surface to be etched.

Prior to etching, the substrate 202, or at least the second surface 202b, can be prepared for better etching result. In one embodiment, as shown in FIG. 2(a), the substrate 202, or at least the second surface 202b, is prepared by a step of cleaning. In various embodiments of the present invention, the step of cleaning the substrate 202, or at least the second surface 202b, can be achieved by Piranha solution cleaning, alkali/$H_2O_2$ cleaning, UV/ozone cleaning, mechanical cleaning such as mechanical abrasion of the substrate, or a combination of them.

Example 3

Two-stage surface modification process-etching the substrate. The etching can be done by different methods according to various embodiments of the present invention.

In various embodiments of the present invention, the etching is done to a surface of the substrate 202, here the second surface 202b, to generate a pattern that acts as nucleation centers for the second stage surface modification.

In the embodiment as shown in FIGS. 2(a) and 2b), at step 201, the etching is performed onto the surface 202b so as to generate a plurality of nucleation sites 204 on the surface 202b of the substrate 202. In this embodiment, the plurality of nucleation sites 204 forms an array that has columns (204x1, 204x2, 204x3, ..., 204xn, where n is an integer greater than 1) along a first direction, the X axis, and rows (204y1, 204y2, 204y3, ..., 204ym, where m is an integer greater than 1) along a second direction, the y axis, which is perpendicular to the first direction. The spacing between two neighboring rows can be same or different over the array, and the spacing between two neighboring columns can be same or different over the array, which could be same or different from that between neighboring rows.

The array of the plurality of nucleation sites 204 can be formed by chemical etching in one embodiment of the present invention. In this embodiment, an etching chemical solution is chosen corresponding to the material, from which the substrate 202, or at least the etching surface 202b, is made. Then the chosen chemical solution is applied to the substrate 202, or at least the etching surface 202b. The step of applying the chosen chemical solution to the substrate 202, or at least the etching surface 202b, includes a step of dipcoating, spincoating, spray coating, or painting.

Alternatively, the array of the plurality of nucleation sites 204 can be formed by plasma etching in one embodiment of the present invention. In this embodiment, an appropriate gas mixture is chosen corresponding to the material, from which the substrate 202, or at least the etching surface 202b, is made. Then a high-speed stream of glow discharge (plasma) of the appropriate gas mixture is shot (in pulses) at the substrate 202, or at least the etching surface 202b.

Example 4

Two-stage surface modification process-depositing the substrate. Still referring to FIGS. 2-3, the second stage surface modification involves depositing a source material, a second material, to the substrate 202, more specifically, to the etched surface 202b.

The source material is deposited on the surface using Glancing Angle Deposition technique. For glancing angle deposition, the deposition can be thermal vapor deposition, pulsed laser deposition and magnetron deposition.

In one embodiment of the present invention, a source material 206 is deposited on the second surface 202b of the substrate 202 by using a magnetron sputtering technique at a glancing angle. The source material can be same as or different from the material from which the substrate 202, or at least the second surface 202b, is made. In various embodiments of the present invention, the source material can be one of a dielectric material, a semiconductor material, an insulator material such as ceramics, a conductor material such as metal or alloy, a polymer material such as polymer and an inorganic material.

The deposition is controlled such that a plurality of nano-structures, or nano-rods, 206a, 206b, 206c, . . . , is formed on the second surface 202b of the substrate 202 in positions corresponding to the plurality of nucleation sites 204. For examples, as particularly shown in FIG. 3, a nano-rod 206a is formed on the position where nucleation site 204xa is, a nano-rod 206b is formed on the position where nucleation site 204xb is, a nano-rod 206c is formed on the position where nucleation site 204xc is, a nano-rod 206d is formed on the position where nucleation site 204xd is, and so on and so forth. The deposition process can be further controlled, for example by a computer controller, such that the deposition path can be a zigzag path, a row by row path, a column by column path, or a progressive circular path from the outside perimeter to the center of the second surface 202 one circle at a time or vice versa.

As such formed, as shown in FIG. 3, a nano-rod, for example, nano-rod 206d, has a height h measuring from the second surface 202b, and a width w. The height h can be same or different for the nano-rods 206. Similarly, the width w can also be same or different for the nano-rods 206. The width w is in general in the range of about 10-100 nm. The plurality of nano-rods has a height to width aspect ratio: h/w>1, for better air trapping ability. The ratio, however, can be h/w>2, 3, . . . , P, P being a non-zero, positive number that is greater than 1. Moreover, the spacing between two neighboring nano-rods, for example, nano-rod 206b and nano-rod 206c, W is in general greater than w. In one embodiment, the spacing W is in general in the range of about 10-100 nm.

Thermal vapor deposition, e-beam evaporation, and pulsed laser deposition are alternatively utilized to practice the present invention, respectively. The deposition angle can be varied from 60-90° to generate oriented nano texture. Since the angle of deposition is high, the shadow effect selectively deposits the material on the rough surface, i.e., the second surface 202b, that was previously etched. This process provides a two-stage surface roughness, or an array of nano-rods 206, which is very similar to the two-stage roughness in most of the self cleansing plant leaves like Lotus. The etching parameters and deposition parameters can be tailored to generate the high-aspect ratio surface roughness. Finally, as shown in FIG. 3, a conformal coating of a polymer like Teflon or a silane is deposited over the array of the nano-rods 206 and the second surface 202b to form an anti-adhesive coating layer 208. Other polymers that are not Teflon may also be utilitzed as a coating material.

Thus, as shown in FIGS. 2 and 3, a high aspect ratio nano-texture surface 202b with a coating of the polymer or silane 208 is provided by the present invention. As set forth above, it is very important to retain the Cassie effect on a surface to make sure that the surface shows superhydrophobicity even with a tiny drop of water (like dew). The nano texture roughness allowed by the high aspect ratio nano-texture surface 202b makes sure that in operation, air is trapped inside the spaces formed among the array of the nao-rods 206, even for a tiny drop of water, and hence it floats on fractal surface. The condensation will be largely reduced as the high aspect ratio of the roughness limits the penetration of the water to the surface 202b. Moreover, the thin coating layer 208 of polymer or silane repels the water condensation, if any.

Additional properties and characterizations of the super-hydrophobic surface 202b can be understood by utilizing SEM technique, Raman technique and other techniques known to people skilled in the art.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1]. Mulherin, N D, R B Haehnel, J F Jones, "Toward developing a standard shear test for ice adhesion", *Proceedings,*

8th *International Workshop on Atmospheric Icing Structures, Reykjavik, Iceland,* Jun. 8-11, 1998, IWAIS '98.

[2]. Lafuma, D. Quere, "Superhydrophobic states", *Nature Materials*, 2 (2003) 457-460.

[3]. Young, T., "An Essay on the Cohesion of Fluids", *Phil. Trans. R. Soc. Lond.,* 95 (1805) 65-87.

[4]. Wenzel, R. N., "Resistance of solid surfaces to wetting by water", *Ind. Eng. Chem.* 28,988-994 (1936).

[5]. Cassie, A. B. D. & Baxter, S., "Wettability of porous surfaces", *Trans. Faraday Soc.* 40,546-551 (1944).

What is claimed is:

1. A method of forming a superhydrophobic surface, comprising the steps of:
    (a) preparing a surface of a substrate of a first material;
    (b) modifying the surface through an etching process to generate a plurality of nucleation sites in an array;
    (c) forming, by using glancing angle deposition, a plurality of nano-rods of a second material and each at a respective one of the plurality of nucleation sites in the array; and
    (d) depositing a conformal coating on the plurality of nano-rods.

2. The method of claim 1, wherein the step of depositing is performed at a deposition angle between 60° and 90° from surface normal.

3. The method of claim 1, wherein each of the plurality of nano-rods has a height to width aspect ratio of greater than 1.

4. The method of claim 1, wherein each of the plurality of nano-rods has a width in the range between about 10 to 100 nm and the spacing between two adjacent nano-rods is in the range between about 10 to 100 nm.

5. The method of claim 4, wherein the spacing between two adjacent nano-rods is smaller than the width of a nano-rod.

6. The method of claim 5, wherein the array has N columns and M rows, each of M and N being an integer greater than 1, and wherein the columns are perpendicular to the rows.

7. The method of claim 1, wherein the first material is one of a dielectric material and an insulator material.

8. The method of claim 7, wherein the second material is same as the first material.

9. The method of claim 1, wherein the second material is a low surface energy material.

10. The method of claim 9, wherein the low surface energy material is an organic polymer.

11. The method of claim 1, wherein the etching process comprises a chemical etching process.

12. The method of claim 1, wherein the etching process comprises a dry plasma etching process.

13. The method of claim 1, wherein the depositing step is performed using one of thermal vapor deposition, pulsed laser deposition, magnetron deposition, sputtering deposition, and e-beam evaporation.

14. The method of claim 1, wherein the depositing step is controlled such that the deposition path is one of a row by row path, a column by column path, and a progressive circular path from an outside perimeter to a center of the modified surface one circle at a time or vice versa.

15. The method of claim 1, wherein the coating is made of a low surface energy material.

16. The method of claim 15, wherein the low surface energy material is Teflon.

17. The method of claim 15, wherein the low surface energy material is a polymer.

18. The method of claim 1, wherein the step (b) further comprises using the etching process to arrange the array of nucleation sites such that the surface with the plurality of nano-rods and the coating has a contact angle of water of more than 150°.

19. The method of claim 1, wherein the first material is one of a semiconductor material and a conductor material.

20. The method of claim 1, wherein the depositing step is controlled such that the deposition path a zigzag path.

* * * * *